US006975549B1

(12) United States Patent
Lin (10) Patent No.: US 6,975,549 B1
(45) Date of Patent: Dec. 13, 2005

(54) LOW POWER DISSIPATING SENSE AMPLIFIER

(75) Inventor: Yu-Shen Lin, Hsinchu (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/863,924

(22) Filed: Jun. 8, 2004

(51) Int. Cl.[7] .......................... G11C 7/00; G11C 16/06
(52) U.S. Cl. ............... 365/205; 365/185.2; 365/185.21; 365/210
(58) Field of Search .................. 365/205, 203, 365/207, 208, 210, 185.2, 185.21; 327/55, 327/57

(56) References Cited

U.S. PATENT DOCUMENTS

| | | | | |
|---|---|---|---|---|
| 5,475,647 A | * | 12/1995 | Yim et al. | 365/230.03 |
| 6,275,441 B1 | * | 8/2001 | Oh | 365/230.04 |
| 6,909,665 B2 | * | 6/2005 | Lee | 365/233 |

* cited by examiner

Primary Examiner—Son Mai
(74) Attorney, Agent, or Firm—Martine Penilla & Gencarella, LLP (57) ABSTRACT

Low power sense amplifier for amplifying a small current difference associated with a memory cell of a memory array is disclosed. The sense amplifier is connected with a memory array having multiple of even columns and multiple of odd columns. A small read current representing the digital data stored at a memory cell is obtained from the memory array via one of the two complementary data lines. The sense amplifier builds a small voltage difference based on a difference between the small read current and a small reference current obtained from a memory array, and amplifies the small voltage difference to produce two amplified signals. One of the amplified signals is selected by the sense amplifier using an even/odd column decoding scheme. The memory array also uses the even/odd column decoding scheme to output the read current to one of the two complementary data lines. A method for how to use the disclosed sense amplifier is also described.

22 Claims, 4 Drawing Sheets

FIG. 4

LOW POWER DISSIPATING SENSE AMPLIFIER

BACKGROUND OF THE INVENTION

1. Field of the Invention

The present invention relates generally to integrated circuits, and more particularly, to low power dissipating sense amplifying circuitry.

2. Description of the Related Art

As is well known in the art, memory devices are generally array structures having a multiplicity of columns and a multiplicity of rows. A memory cell, located at an intersection of a selected row and column, is addressed by activating the control signals for the associated row and column. Once the digital data stored at the memory cell is read, a small read current is sensed. In order to produce a readable data signal representing the digital data stored at the memory cell, a sense amplifier is typically implemented to amplify a small voltage difference built from a difference between the small read current and a reference current. The performance of a sense amplifier strongly affects both memory access time, and overall memory power dissipation. As with other integrated circuits today, memory devices are required to increase speed, reduce space and maintain low power dissipation.

Figure 1:
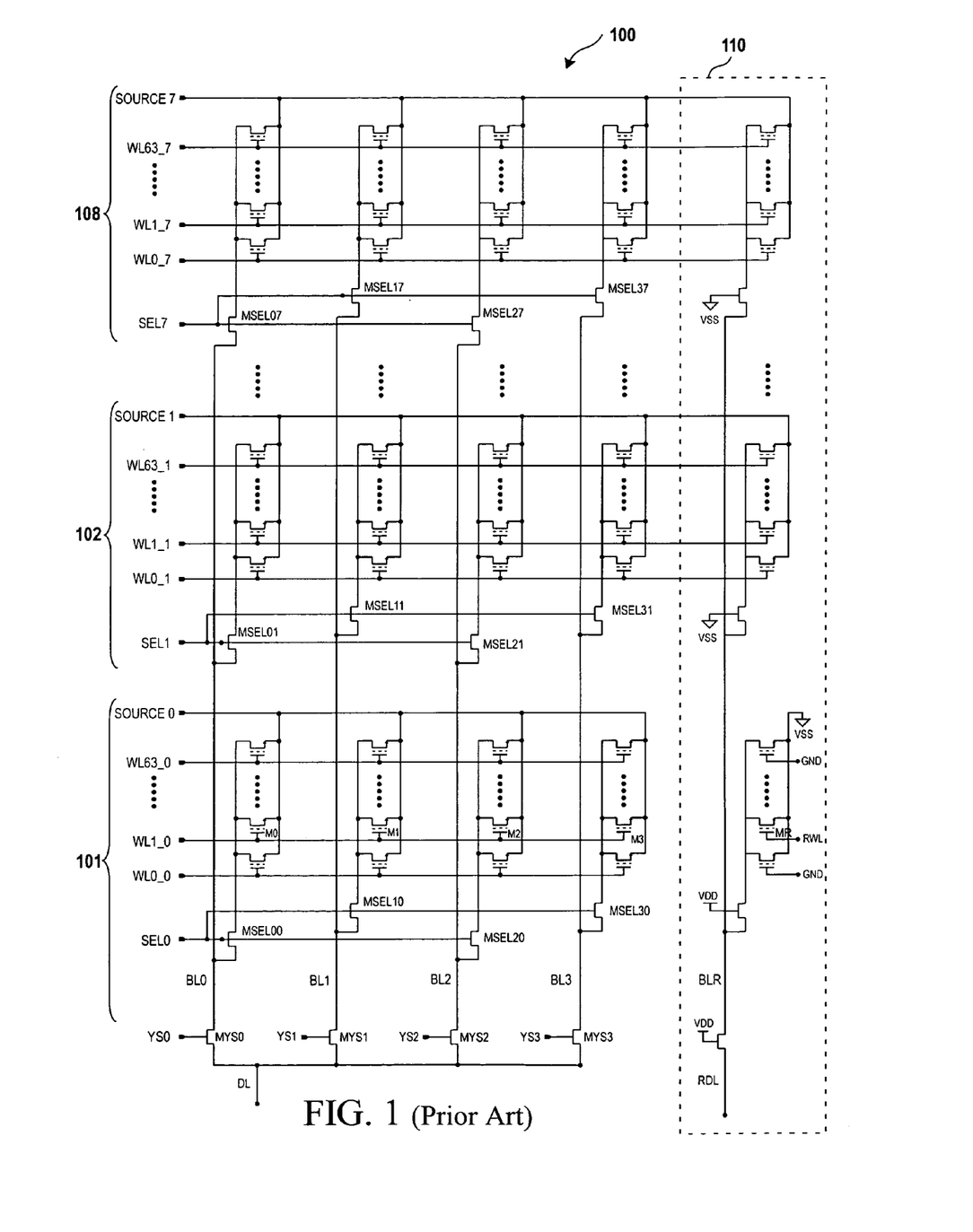
FIG. 1 shows a conventional memory array used for accessing the digital data stored at a memory cell.

FIG. 1 illustrates an example of a conventional memory array 100. The memory array 100 comprises 8 memory blocks (memory block 101, memory block 102, . . . memory block 108), a reference cell circuit 110, and 4 pass gates (MYS0, MYS1, MYS2, and MYS3). Each memory block has 256 memory cells that are arranged in 4 columns with 64 memory cells per column. A memory block further includes 4 column select gates, a column select control signal, a read/write control signal, and 64 word lines (WL). The memory array 100 is connected to a sense amplifier via the reference data line (RDL) and the data line (DL). For example, the memory cell $M_0$ of the memory block 101 can be addressed by raising the word line WL1_0, the column select control signal SEL0, and the pass gate control signal YS0 to the value of a rail voltage source $V_{DD}$ while keeping the rest of the column select control signals, word lines, and the read/write control signals of the memory array 100 to ground. After the memory cell $M_0$ is read, a small read current representing the digital data stored at the memory cell $M_0$ is sensed and output to the DL via the column select gate MSEL00 and the pass gate MYS0. The small read current on the DL is in turn passed to a sense amplifier. A small reference current can be obtained via the RDL of the reference cell circuit 110 of the memory array 100.

Figure 2:
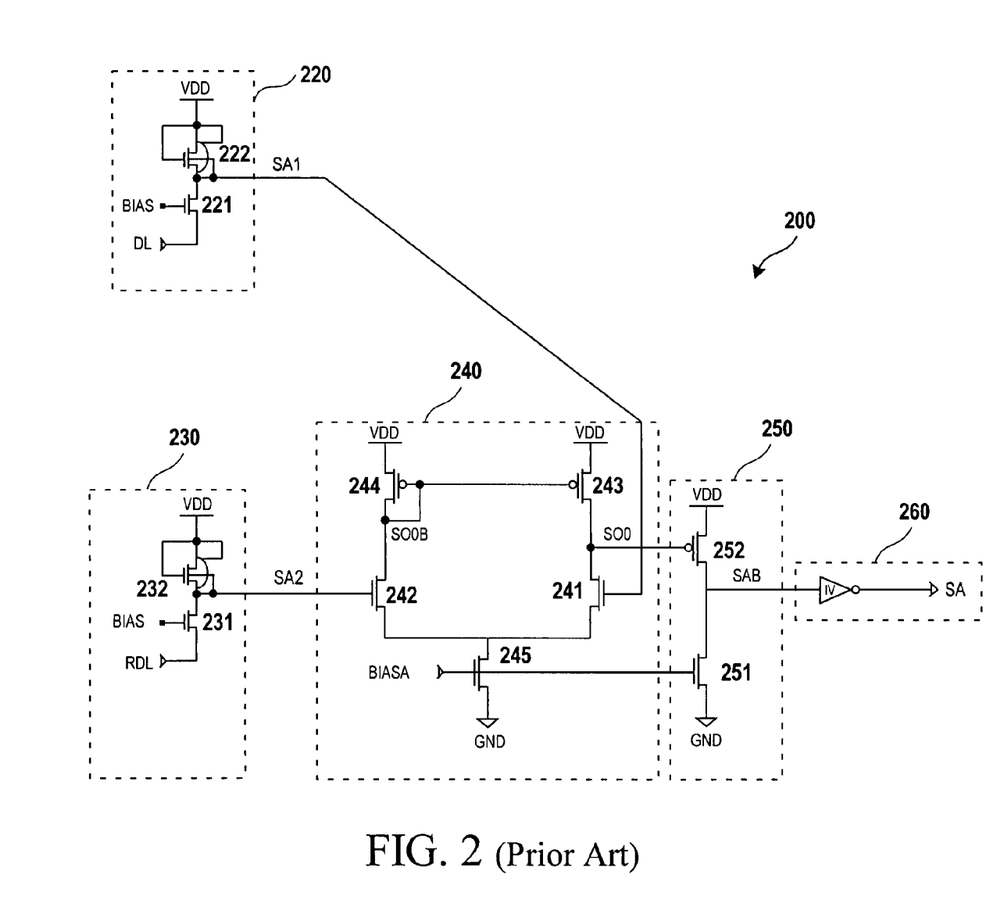
FIG. 2 shows a conventional sense amplifier used to amplify a small voltage difference associated with a memory cell of the memory array shown in FIG. 1.

FIG. 2 is a conventional sense amplifier 200 which can be connected to the memory array 100 via the DL and the RDL. As shown, the sense amplifier 200 comprises 5 parts: the circuit 220, the circuit 230, the circuit 240, the circuit 250, and the circuit 260. The circuits 220 and 230 are used to convert the small read current obtained from the DL and the small reference current obtained from the RDL into a small voltage amplitude and a small reference voltage amplitude on the signal lines SA1 and SA2, respectively. The circuit 240 and 250 are two amplifying circuits, and the circuit 260 is an inverting circuit. $V_{DD}$ is a rail voltage source. The n-channel transistors 221 and 231 are always on by the BIAS control signals. Two identical loading transistors 222 and 232 act as large resistors. A small reference voltage amplitude is built on the signal line SA2. The small voltage amplitude on the signal line SA1 depends upon the digital data stored at the addressed memory cell. If the digital data stored at the memory cell is "1", the small voltage amplitude on the signal line SA1 is slightly smaller than the small reference voltage amplitude. Otherwise, the small voltage amplitude on the signal line SA1 is slightly larger than the small reference voltage amplitude. The circuit 240 is a differential amplifier that is composed of five transistors 241, 242, 243, 244 and 245. The p-channel transistors 243 and 244 form a well know current mirror. The n-channel transistor 241 and 242 are gain transistors, which amplifies the small voltage difference between the small voltage amplitude on the signal line SA1 and the small reference voltage amplitude on the signal line SA2. The n-channel transistor 245, activated by the BIASA control signal, limits the current consumption of the differential amplifier 240. When the small voltage amplitude at the signal line SA1 is about 1.25V, the transistor 241 is on. Consequently, the output of the differential amplifier 240 at the signal line SO0 will be pulled down to "0". The circuit 250 is a complementary metal-oxide-semiconductor (CMOS) amplifying circuit, which includes one n-channel transistor 251 and one p-channel transistor 252. When the input of the circuit 250 (from the signal line SO0) is "0", the output of the circuit 250 at the signal line SAB will be "1", which is then inverted again by the circuit 260. The resulting output at the signal line SA will be "0".

In order to match the large parasitic capacitance loading from the DL of the memory array 100, the reference cell circuit 110 has to use many dummy cells. As shown in FIG. 1, the number of the dummy cells and the reference cell of the reference cell circuit 110 needs to equal the number of the memory cells at a column of the memory array 100. As a result, the reference cell circuit 110 of the memory array 100 occupies more space in the layout. The use of a differential amplifier in the conventional sense amplifier 200 causes it to consume more power. Especially in the page mode, when many sense amplifiers have to be triggered at the same time, the reference cell circuit space occupation and sense amplifier power dissipation problems will become even more severe.

In view of the foregoing, there is a need for a sense amplifier that is low power consuming, occupies less space, and maintains fast accessing speed.

SUMMARY OF THE INVENTION

Broadly speaking, the present invention fills this need by providing a low power sense amplifier. Having multiple of even columns and multiple of odd columns, a memory array is connected to the sense amplifier and is output a sensed small read current to this sense amplifier via one of the two complementary data lines defined by a data line and an inverse data line. The memory array is configured to have the read current sensed from the memory cell at one of the pair of odd columns to the inverse data line, and to have the read current sensed from the memory cell at one of the pair of even columns to the data line. Only one of the two complementary data lines will be accessed for the small read current. The two complementary data lines will also provide parasitic capacitance loadings to the sense amplifier. The use of an even/odd column decoding scheme by the sense amplifier and the memory array reduces the space occupied by the memory device. A method for operating this sense amplifier is also described.

In accordance with one aspect of the present invention, a sense amplifier is described. Connected with a memory array having a pair of even columns and a pair of odd columns, the sense amplifier comprises a signal amplifying circuit and an output selecting circuit. The signal amplifying circuit amplifies a small voltage difference built from the difference between a small read current and a small reference current, and produces two amplified signals. The output selecting circuit selects one of the two amplified signals depending upon whether the memory cell sensed is located at an even column or an odd column of the memory array.

In accordance with another aspect of the present invention, a sense amplifier is provided. Coupled with a memory array having a pair of even columns and a pair of odd columns, the sense amplifier comprises a signal building circuit, a signal amplifying circuit, and an output selecting circuit. The signal building circuit is responsible for building a small voltage difference based on a difference between a small read current and a small reference current. The small voltage difference is then amplified by the signal amplifying circuit to produce two amplified signals. The output selecting circuit selects one of the two amplified signals depending upon whether the memory cell sensed is located at an even column or an odd column of the memory array.

In accordance with yet another aspect of the present invention, a method for operating such a sense amplifier is disclosed. The method comprises five stages: a pre-charging stage, a signal building stage, a signal latching stage, a signal amplifying stage, and an output selecting stage. In the pre-charging stage, two signal lines are charged up to a pre-defined voltage value. A small voltage difference will be built on these two signal lines in the signal building stage. The small voltage difference built will be latched for amplifying. In the signal latching stage, the latched small voltage difference will be isolated from the large parasitic capacitance loadings on the two signal lines. The latched small voltage difference will be amplified in the signal amplifying stage and two amplified signals will be generated. One of the amplified signals will be selected as the output signal in the output selecting stage based on the location of the memory cell at the memory array 300.

A cross-coupled inverter pair is used in the signal amplifying circuit of the disclosed sense amplifier instead of a differential amplifier. Because the cross-coupled inverter pair requires less power to operate than the differential amplifier, therefore, the sense amplifier will consume less power. Furthermore, since the memory array provides large parasitic capacitance loadings to the sense amplifier via two complementary data lines, the reference cell circuit of the memory array is not required to provide a large parasitic capacitance loading to the sense amplifier. As a result, the reference cell circuit of the memory array requires less space by reduce the number of dummy cells.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 3:
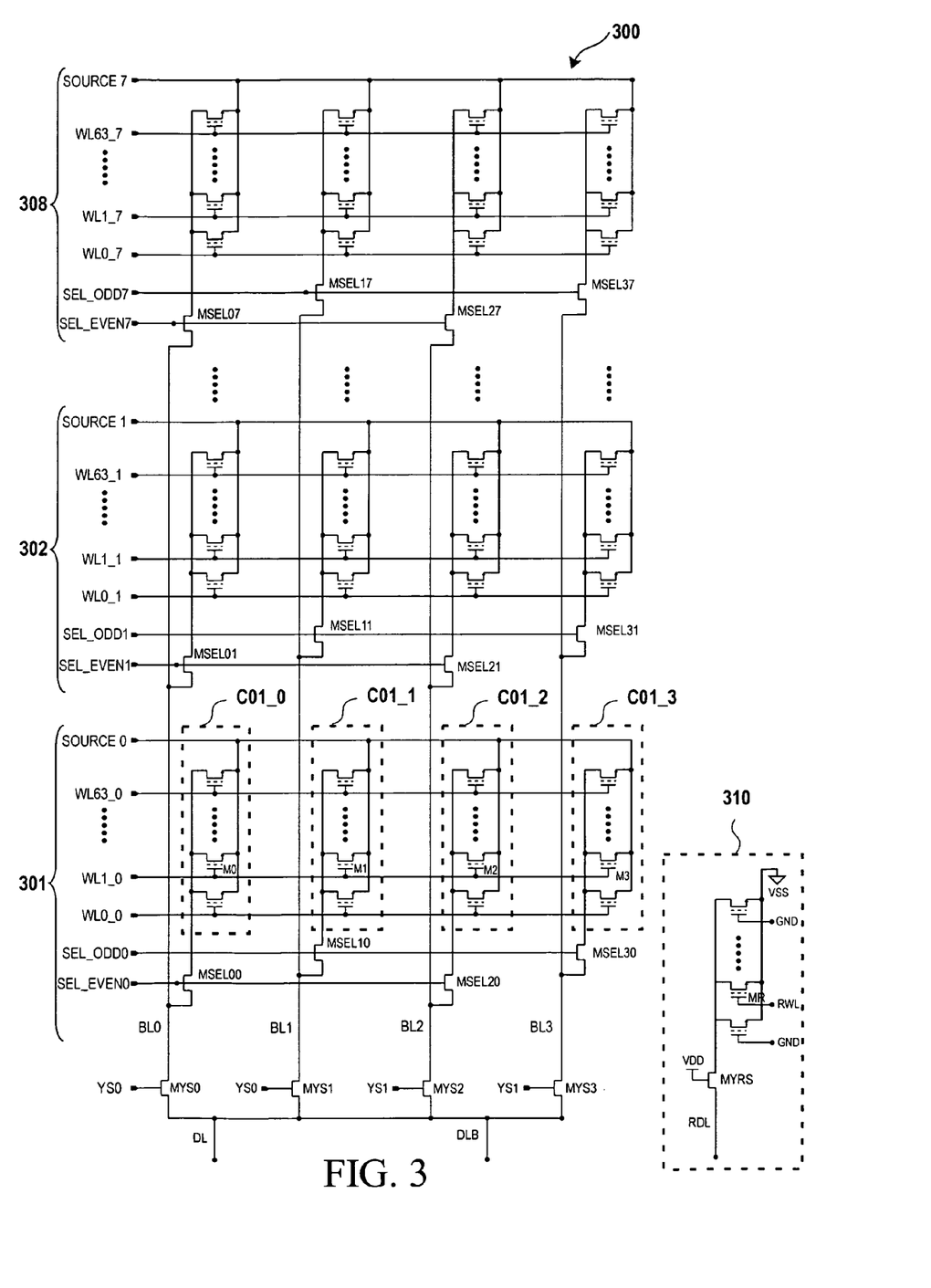
FIG. 3 shows a memory array in accordance with one embodiment of the present invention.

Referring first to FIG. 3, a memory array 300 is shown in accordance with one embodiment of the present invention. The memory array 300 comprises eight memory blocks 301, 302, ... 308, one reference cell circuit 310, and 4 n-channel pass gates (MYS0, MYS1, MYS2, and MYS3) which are controlled by 2 pass gate control signals (YS0 and YS1). Each memory block has a pair of even columns and a pair of odd columns. By way of an example, the memory block 301 has 256 memory cells arranged in 4 columns and 64 rows with 64 memory cells per column and 4 memory cells per row. The 4 columns of the memory cells are divided into even columns (col_0 and col_2) and odd columns (col_1 and col_3). 64 word lines WL0_0, WL1_0, ... WL63_0 are responsible for trigging the memory cells at each row.

One terminal of each of the 256 memory cells is coupled to a read/write control signal SOURCE0. The other terminal of each of the memory cells at a column is connected to a terminal of a column select gate. Each column has one column select gate. The n-channel column select gates MSEL00 and MSEL20, which are controlled by the even column select control signal SEL_EVEN0, are responsible to output a small read current sensed from a memory cell at one of the pair of even columns (col_0 and col_2). Accordingly, the n-channel column select gates MSEL10 and MSEL30, which are controlled by the odd column select control signal SEL_ODD0, will output a small read current sensed from a memory cell at one of the pair of odd columns (col_1 and col_3). The rest of the 7 memory blocks 302 to 308 have the same layout as the memory block 301. The 4 column select gates MSEL00, MSEL10, MSEL20, and MSEL30 are connected to 4 pass gates MYS0, MYS1, MYS2, and MYS3, respectively, via the signal lines BL0, BL1, BL2, and BL3.

The pass gates MYS0 and MYS1 are controlled by the pass gate control signal YS0, while the other two pass gates MYS2 and MYS3 are controlled by the pass gate control signal YS1. The terminals of the pass gates MYS0 and MYS2 are connected to the data line (DL), and the terminals of the pass gates MYS1 and MYS3 are connected to the inverse data line (DLB). Therefore, the DL will output a small read current sensed from a memory cell at one of the pair of even columns, while the DLB will output a small read current sensed from a memory cell at one of the pair of odd columns.

As shown in FIG. 3, the reference cell circuit 310 includes 1 reference cell MR and 63 dummy cells. One terminal of the reference cell and each of the 63 dummy cells is coupled to a voltage source $V_{SS}$ and the other terminal of the reference cell and each of the 63 dummy cells is coupled to a n-channel pass gate MYRS. The reference cell is controlled by a reference word line (RWL) and the gate terminals of all the dummy cells are tied to ground. The pass gate MYRS is controlled by the rail voltage source $V_{DD}$. In one embodiment, the $V_{DD}$ is about 1.5V. One of the terminals of the pass gate MYRS is connected to the reference data line (RDL).

By using an even/odd column decoding scheme, the small read current sensed from a memory cell of the memory array 300 appears on the DL and the DLB alternatively depending upon the location of the memory cell. When the memory cell at an even column is read, the DL will output the small read current. When the memory cell of an odd column is read, the DLB will output the small read current. By way of example, when the memory cell $M_0$ of the memory block 301 is read, the read/write control signals SOURCE0 to SOURCE7 are all set to 0. Because the memory cell $M_0$ is located at the even column col_0, the column select control signal SEL_EVEN0 is set to $V_{DD}$, while the rest of the column select control signals (SEL_ODD0–7 and SEL_EVEN1–7) are all set to "0". The pass gate control signal YS0 is set to $V_{DD}$ to trigger the pass gates MYS0 such that the small read current on the signal lines BL0 can be output to the DL. Although the pass gate MYS1 is turned on by the pass gate control signal YS0, the column select gate MSEL10 is turned off by the column select control signal SEL_ODD0. Thus, no data signal will pass through the DLB. In this case, the DLB is connected to a sense amplifier just to provide a large parasitic capacitance loading used to match with the one from the DL.

The memory array 300 has the following three features. First, the column select gates in the memory array 300 are controlled by even and odd column select control signals, whereas the column select gates in the memory array 100 are only controlled by one column select control signal. Second, the memory array 300 has only two pass gate control signals (YS0 and YS1), while the memory array 100 has 4 pass gate control signals (YS0, YS1, YS2, and YS3). And third, the reference cell circuit 310 of the memory array 300 is much smaller compared to the reference cell circuit 110 in the memory array 100 due to the fact that both the DL and the DLB will provide large parasitic capacitance loadings. Since the reference cell circuit 310 is not required to provide a large parasitic capacitance loading, the reference cell circuit 310 does not need to have many dummy cells. Thus, the memory array 300 saves circuit layout space by using the even/odd column decoding scheme.

Figure 4:
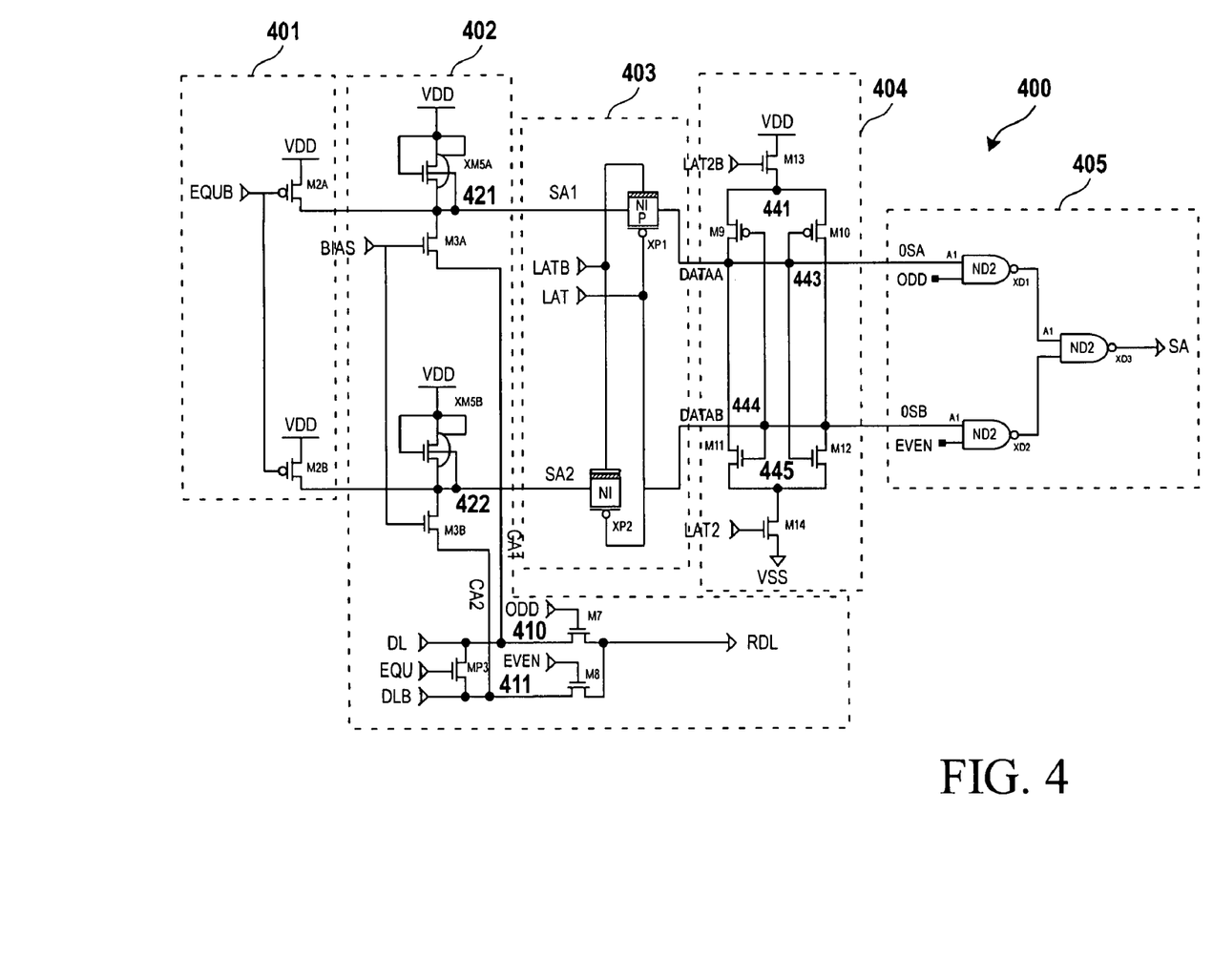
FIG. 4 illustrates a sense amplifier used to amplify a small voltage difference associated with a memory cell of the memory array shown in FIG. 3 in accordance with one embodiment of the present invention.

Referring now to FIG. 4, a circuit diagram of the preferred electrical interconnections contained within a sense amplifier 400 is shown in accordance with one embodiment of the present invention. The sense amplifier 400 is used to build and amplify a small voltage difference obtained from the DL and the RDL of the memory array 300. The sense amplifier 400 can be divided into 5 circuits: the pre-charging circuit 401, the signal building circuit 402, the signal latching circuit 403, the signal amplifying circuit 404, and the output selecting circuit 405.

The pre-charging circuit 401 is responsible for charging the signal lines SA1 and SA2 to the value of a rail voltage power source $V_{DD}$ before a memory cell of the memory array 300 is read. The p-channel transistors M2A and M2B can be triggered by the control signal EQUB. One terminal of each of the transistors M2A and M2B is coupled to a rail voltage power source $V_{DD}$. The other terminal of each of the transistors M2A and M2B is coupled to the nodes 421 and 422, which in turn are coupled to the signal lines SA1 and SA2, respectively. When the transistors M2A and M2B are turned on, the signal lines SA1 and SA2 will be charged up to the value of $V_{DD}$. In one embodiment, the rail voltage source $V_{DD}$ is about 1.5V.

The signal building circuit 402 is used to build a small voltage difference from a small read current and a small reference current. The memory array 300 is connected to the sense amplifier 400 via the DL, the DLB, and the RDL in the signal building circuit 402. The DL and the DLB are coupled to the nodes 410 and 411, respectively. The nodes 410 and 411 are then coupled to one terminal of the n-channel transistors M7 and M8, and to the signal lines CA1 and CA2, respectively. An n-channel transistor MP3 is connected between the DL and the DLB via its two terminals. The n-channel transistors M3A and M3B are always on due to the constant activation of the BIAS control signal. One terminal of the transistor M3A is coupled to the signal line CA1, while one terminal of the transistor M3B is coupled to the signal line CA2. The other terminal of each of the transistors M3A and M3B is coupled to a terminal of each of the two identical load transistors XM5A and XM5B. The transistors XM5A and XM5B function as large resistors with the other terminals connected to a rail voltage source $V_{DD}$.

Because of the use of the even/odd column decoding scheme in the memory array 300, the small read current sensed from a memory cell of the memory array 300 appears on one of the two complementary data lines (the DL and the DLB) depending on the location of the memory cell that is to be read. The identification of which data line will carry the small read current in the signal building circuit 402 is also carried out by the even/odd column decoding scheme which utilizes an EVEN and an ODD control signals. When the memory cell is located at an even column of the memory array 300, the DL will carry the read current which is sent to the signal line CA1 via a node 410. Because the ODD control signal is not activated, the transistor M7 is off. The EVEN control signal will be raised up to the value of $V_{DD}$ to turn on the transistor M8. Thus, a small reference current obtained from the reference cell circuit 310 via the RDL is sent to the signal line CA2 via the node 411.

When the memory cell is located at an odd column, the DLB will carry will carry the read current to the signal line CA2 via node 411. Because the EVEN control signal is not activated, the transistor M8 is off. The ODD control signal will be activated to trigger the transistor M7. As a result, a small reference current is obtained from the reference cell circuit 310 of the memory array 300 via the RDL, and sent to the signal line CA1 via the node 410. The DL and the DLB, with or without the read current, will provide large parasitic capacitance loadings to signal lines CA1 and CA2 via the nodes 410 and 411. The large parasitic capacitance loadings to signal lines CA1 and CA2 can range from 0.25 pF to 10 pF. The transistor MP3, controlled by the gate control signal EQU, is used to equal the voltage potentials between the DL and the DLB.

After obtaining the small read current and the small reference current on the two signal lines CA1 and CA2, a small voltage difference is built on the signal lines SA1 and SA2 due to the difference between the small read current and the small reference current. In one embodiment, the small voltage difference is about 100 mV. Of course, this voltage can range between about 1.0 mV and about 3000 mV.

The signal latching circuit 403 comprises two transmission gates XP1 and XP2, which are triggered by the control signals LAT and LATB. One terminal of the transmission gate XP1 is connected to the signal line SA1, while the other terminal of the transmission gate XP1 is connected to the signal line DATAA. One terminal of transmission gate XP2 is connected to the signal line SA2, while the other terminal of the transmission gate XP2 is connected to the signal line DATAB. When the control signals LAT=0 and LATB=$V_{DD}$, the transmission gates XP1 and XP2 are shut off. As a result, no signals will pass through the signal lines SA1 and SA2 to the signal lines DATAA and DATAB. When the transmission gates XP1 and XP2 are off, the parasitic capacitance loadings on the signal lines SA1 and SA2 will be isolated from the signal lines DATAA and DATAB. When the control signals LAT=$V_{DD}$ and LATB=0, the transmission gates XP1 and XP2 are turned on. As a result, the small voltage difference built on the signals line SA1 and SA2 will be latched to the signal lines DATAA and DATAB.

The signal amplifying circuit 404 comprises a cross-coupled inverter pair. The transistors M9, M10, and M13 are p-channel transistors, while the transistors M11, M12, and M14 are n-channel transistors. The transistors M13 and M14 can be activated by the control signals LAT2B and LAT2, respectively. One terminal of the transistor M13 is connected with a rail voltage source $V_{DD}$, and the other terminal of the transistor M13 is coupled to a node 441, which in turn is coupled to the terminals of the transistors M9 and M10. The other terminal of the transistor M9 is coupled to a node 443, which is then coupled to one terminal of the transistor M11 and the gate terminals of the transistors M10 and M12. The other terminal of the transistor MIO is coupled to a node 444, which in turn is coupled to one terminal of the transistor M12 and the gate terminals of the transistors M9 and M11. The signal lines DATAA and DATAB are connected to the nodes 443 and 444, which are in turn coupled to signal lines OSA and OSB, respectively. The other terminals of the transistor M11 and M12 are coupled to the node 445, which is then coupled to one terminal of the transistor M14. The other terminal of the transistor M14 is connected to a voltage source $V_{SS}$ ($V_{SS}$=0). The signal amplifying circuit 404 will amplify the small voltage difference between the signal lines DATAA and DATAB and output two amplified signals to the signal lines OSA and OSB.

The output selecting circuit 405 comprises three NAND gates XD1, XD2, and XD3. The NAND gate XD1 has two inputs: the signal line OSA and an ODD control signal, while the NAND gate XD2 has two inputs: the signal line OSB and an EVEN control signal. Each of NAND gates XD1 and XD2 has an output. The outputs of the gates XD1 and XD2 will become the input signals for the gate XD3, which in turn generates an output signal to the signal line SA. The output selecting circuit 405 will select one of the amplified signals from the signal lines OSA and OSB by using the even/odd column decoding scheme which utilizes the EVEN and the ODD control signals. If the memory cell read is located at an even column of the memory array 300, the amplified signal at the signal line OSB will be selected as the output signal by activating the EVEN control signal (EVEN=$V_{DD}$). Whereas, if the memory cell is located at an odd column of the memory array 300, the amplified signal at the signal line OSA will be selected as the output signal by activating the ODD control signal (ODD=$V_{DD}$).

The operation of the sense amplifier 400 can be divided into five stages. The first is a pre-charging stage, the second is a signal building stage, the third is a signal latching stage, the fourth is a signal amplifying stage, and the fifth is an output selecting stage.

1). Pre-Charging Stage

The purpose of the stage is to fast charge the signal lines SA1 and SA2 to the value of $V_{DD}$. The control signals of the sense amplifier 400 are set as follows for this stage of operation:

EQUB=0V, EQU=$V_{DD}$, LAT=0, LATB=$V_{DD}$, LAT2=0V, LAT2B=$V_{DD}$. Preferably, this pre-charging stage will last about 20 ns. When the gate control signal EQUB=0V, the transistors M2A and M2B will be turned on. As a result, the signal lines SA1 and SA2 will be charged to the value of $V_{DD}$. Because the control signals LAT=0 and LATB=$V_{DD}$, the transmission gates XP1 and XP2 of the signal latching circuit 403 are turned on. Consequently, the signal lines DATAA and DATAB will be charged to the value of $V_{DD}$ as well. Since the control signals LAT2=0V and LAT2B=$V_{DD}$, the transistors M13 and M14 are not triggered. Thus, the cross-coupled inverter pair of the signal amplifying circuit 404 will not be able to function. At the same time, one of the EVEN and ODD control signals are triggered depending upon the location of the memory cell at the memory array 300, a small read current and a small reference current will be obtained.

2). Signal Building Stage

The purpose of this stage is to build a small voltage difference on the signal lines SA1 and SA2. In this stage, only the control signals EQUB and EQU are changed (EQUB= $V_{DD}$, EQU=0V), and the rest of control signals remain the same. As a result, the transistors M2A and M2B are turned off. Because the two load transistors XM5A and XM5B are identical, a small voltage difference will be built between node 421 and 422 due to the small difference between the small read current and the small reference current. Furthermore, because the control signals LAT and LATB are unchanged (LAT=0 and LATB=$V_{DD}$), the small voltage difference on the signal lines SA1 and SA2 are latched into the signal lines DATAA and DATAB. Preferably, the signal building stage should last about 10 ns.

3). Signal Latching Stage

The purpose of this stage is to latch the small voltage difference between the signal lines DATAA and DATAB into the cross-coupled inverter pair. For this stage, the control signal LAT is changed from 0 to $V_{DD}$, and the control signal LATB is changed from $V_{DD}$ to 0. The other control signals are unchanged. As a result, the transmission gates XP1 and XP2 are turned off. Preferably, this signal latching stage should last about 2 ns.

4). Signal Amplifying Stage

The amplifying stage is carried out in two steps. The purpose of the first step of the signal amplifying stage is to provide a ground power to the transistors M11 and M12 and to amplify the small voltage difference on the signal lines DATAA and DATAB. The control signal LAT2 is changed from 0 to $V_{DD}$ at this stage, and the rest of control signals are unchanged. Preferably, this first step should take about 3 ns. The signal lines DATAA and DATAB are coupled to the nodes 443 and 444, respectively. Between these two nodes 443 and 444, the node with a lower voltage will be discharged to the ground to generate a first amplified output on this node.

The purpose of the second step of this stage is to provide a voltage source ($V_{DD}$) to the transistors M9 and M10 and to further amplify the small voltage difference between the signal lines DATAA and DATAB, i.e., between the nodes 443 and 444. For the nodes 443 and 444, the node with a higher voltage will be charged up to $V_{DD}$ to generate a second amplified output on this node. For this stage, the control signal LAT2B is changed from $V_{DD}$ to 0, and the rest of control signals are unchanged. Preferably, the second step of this stage should take about 3 ns.

5). Output Selecting Stage

The purpose of this stage is to select one of the amplified outputs from either the signal line OSA or the signal line OSB. The selection for one of the amplified output is done by activating either the EVEN or the ODD control signal depending upon the location of the memory cell read. If the memory cell is located at an even column at the memory array 300, the EVEN control signal will be activated. Otherwise, the ODD control signal will be activated.

The use of a cross-coupled inverter pair instead of a differential sense amplifier allows the sense amplifier 400 to consume less power. Furthermore, the sense amplifier 400 along with the memory array 300 occupies less space because the even/odd column decoding scheme. As a result, the sense amplifier 400 along with the memory array 300 occupies less space and consumes less power without a speed penalty.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A sense amplifier for sensing and amplifying a current difference sensed from a memory cell of a memory array having multiple of even columns and multiple of odd columns, the sense amplifier comprising:
   a signal amplifying circuit for amplifying the current difference between a first signal line and a second signal line, the memory cell being located at a column of one of the multiple of even columns and the multiple of odd columns, the signal amplifying circuit being configured to produce a first amplified signal and a second amplified signal; and
   an output selecting circuit for selecting one of the first amplified signal and the second amplified signal, the first amplified signal being selected when the memory cell being sensed is located at one of the pair of odd columns, the second amplified signal being selected when the memory cell being sensed is located at one of the pair of even columns.

2. The sense amplifier for sensing and amplifying a current difference sensed from a memory cell of a memory array having multiple of even columns and multiple of odd columns as recited in claim 1, further comprising:
   a pre-charging circuit for charging the first signal line and the second signal line to a pre-defined value before the memory cell of the memory array is read.

3. The sense amplifier for sensing and amplifying a current difference sensed from a memory cell of a memory array having multiple of even columns and multiple of odd columns as recited in claim 1, further comprising:
   a signal building circuit for building the voltage difference on the first signal line and the second signal line based on a difference between a read current and a reference current sensed from the memory array, the read current being associated with digital data stored at the memory cell of the memory array, the signal building circuit being configured to obtain the read current from the memory array via one of two complementary data lines defined by a data line and an inverse data line, the two complementary data lines having parasitic capacitance loadings.

4. The sense amplifier for sensing and amplifying a current difference sensed from a memory cell of a memory array having multiple of even columns and multiple of odd columns as recited in claim 3, wherein the signal building circuit is configured to obtain the read current from the inverse data line when the memory cell is located at one of the multiple of odd columns, and from the data line when the memory cell is located at one of the multiple of even columns.

5. The sense amplifier for sensing and amplifying a current difference sensed from a memory cell of a memory array having multiple of even columns and multiple of odd columns as recited in claim 3, wherein the memory array is configured to have the read current sensed from the memory cell at one of the multiple of odd columns to the inverse data line, and to have the read current sensed from the memory cell at one of the multiple of even columns to the data line.

6. The sense amplifier for sensing and amplifying a current difference sensed from a memory cell of a memory array having multiple of even columns and multiple of odd columns as recited in claim 1, further comprising:
   a signal latching circuit for latching the voltage difference when the signal latching circuit is on, and isolating the voltage difference from the parasitic capacitance loadings when the signal latching circuit is off.

7. A sense amplifier for sensing and amplifying a current difference sensed from a memory cell of a memory array having multiple of even columns and multiple of odd columns as recited in claim 1, wherein the signal amplifying circuit is a cross-coupled inverter pair.

8. The sense amplifier for sensing and amplifying a current difference sensed from a memory cell of a memory array having multiple of even columns and multiple of odd columns, the sense amplifier comprising:
   a signal building circuit for building the voltage difference on a first signal line and a second signal line based on a difference between a read current and a reference current sensed from the memory array, the read current being associated with digital data stored at the memory cell of the memory array, the memory cell being located at a column of one of the multiple of even columns and the multiple of odd columns, the signal building circuit being configured to obtain the read current from the memory array via one of two complementary data lines defined by a data line and an inverse data line, the two complementary data lines having parasitic capacitance loadings;
   a signal amplifying circuit for amplifying the voltage difference between the first signal line and the second signal line, the signal amplifying circuit being configured to produce a first amplified signal and a second amplified signal; and
   an output selecting circuit for selecting one of the first amplified signal and the second amplified signal, the first amplified signal-being selected when the memory cell being sensed is located at one of the multiple of odd columns, the second amplified signal being selected when the memory cell being sensed is located at one of the multiple of even columns.

9. The sense amplifier for sensing and amplifying a current difference sensed from a memory cell of a memory array having multiple of even columns and multiple of odd columns as recited in claim 8, further comprising:
a pre-charging circuit for charging the first signal line and the second signal line to a pre-defined value before the memory cell of the memory array is read.

10. The sense amplifier for sensing and amplifying a current difference sensed from a memory cell of a memory array having multiple of even columns and multiple of odd columns as recited in claim 8, further comprising:
a signal latching circuit for latching the voltage difference when the signal latching circuit is on, and isolating the voltage difference from the parasitic capacitance loadings when the signal latching circuit is off.

11. The sense amplifier for sensing and amplifying a current difference sensed from a memory cell of a memory array having multiple of even columns and multiple of odd columns as recited in claim 8, wherein the signal building circuit is configured to obtain the read current from the inverse data line when the memory cell is located at one of the multiple of odd columns, and from the data line when the memory cell is located at one of the multiple of even columns.

12. The sense amplifier for sensing and amplifying a current difference sensed from a memory cell of a memory array having multiple of even columns and multiple of odd columns as recited in claim 8, wherein the memory array is configured to have the read current sensed from the memory cell at one of the multiple of odd columns to the inverse data line, and to have the read current sensed from the memory cell at one of the multiple of even columns to the data line.

13. The sense amplifier for sensing and amplifying a current difference sensed from a memory cell of a memory array having multiple of even columns and multiple of odd columns as recited in, claim 8, wherein the signal amplifying circuit is a cross-coupled inverter pair.

14. A method for sensing and amplifying a current difference sensed from a memory cell of a memory array having multiple of even columns and multiple of odd columns, comprising:
selecting the memory cell located at a column of one of the multiple of even columns and the multiple of odd columns;
sensing a read current associated with digital data stored at the memory cell of the memory array from one of two complementary data lines defined by a data line and an inverse data line;
obtaining a reference current from the memory array;
building the voltage difference between a first signal line and a second signal line based on a difference between the read current and the reference current;
amplifying the voltage difference to produce a first amplified signal and a second amplified signal; and
selecting one of the first amplified signal and the second amplified signal, the first amplified signal being selected when the memory cell being sensed is located at one of the multiple of odd columns, the second amplified signal being selected when the memory cell being sensed is located at one of the multiple of even columns.

15. The method for sensing and amplifying a current difference sensed from a memory cell of a memory array having multiple of even columns and multiple of odd columns as recited in claim 14, further comprising:
charging the first signal line and the second signal line to a pre-defined voltage value before the memory cell is read.

16. The method for sensing and amplifying a current difference sensed from a memory cell of a memory array having multiple of even columns and multiple of odd columns as recited in claim 14, further comprising:
latching the voltage difference between the first signal line and the second signal line to a third signal line and a fourth signal line, and then isolating the small voltage difference on the third and the fourth signal line from parasitic capacitance loadings.

17. The method for sensing and amplifying a current difference sensed from a memory cell of a memory array having multiple of even columns and multiple of odd columns as recited in claim 14, wherein the amplifying comprises a first amplifying operation and a second amplifying operation, the first amplifying operation is configured to discharge one of the third signal line and the fourth signal line that has a lower voltage to ground, the second amplifying operation is configured to charge one of the third signal line and the fourth signal line that has a higher voltage to a pre-defined voltage value.

18. The method for sensing and amplifying a current difference sensed from a memory cell of a memory array having multiple of even columns and multiple of odd columns as recited in claim 14, wherein the amplifying is performed by a cross-coupled inverter pair.

19. The method for sensing and amplifying a current difference sensed from a memory cell of a memory array having multiple of even columns and multiple of odd columns as recited in claim 14, wherein the sensing and the selecting are being carried out by a first control signal and a second control signal, the first control signal is being configured to associate with the memory cell located at one of the multiple of odd columns, the second control signal is being configured to associate with the memory cell located at one of the multiple of even columns.

20. The method for sensing and amplifying a current difference sensed from a memory cell of a memory array having multiple of even columns and multiple of odd columns as recited in claim 19, wherein the sensing is carried out by obtaining the read current from the data line when the first control signal is activated, and obtaining the read current from the inverse data line when the second control signal is activated.

21. The method for sensing and amplifying a current difference sensed from a memory cell of a memory array having multiple of even columns and multiple of odd columns as recited in claim 19, wherein the selecting is being carried out by selecting the first amplified signal when the first control signal is activated, and selecting the second amplified signal when the second control signal is activated.

22. The method for sensing and amplifying a current difference sensed from a memory cell of a memory array having multiple of even columns and multiple of odd columns as recited in claim 14, wherein the memory array is configured to have the read current sensed from the memory cell at one of the multiple of odd columns to the inverse data line, and to have the read current sensed from the memory cell at one of the multiple of even columns to the data line.

\* \* \* \* \*